(12) United States Patent
Lee et al.

(10) Patent No.: US 12,557,590 B2
(45) Date of Patent: Feb. 17, 2026

(54) SUBSTRATE TRANSFER DEVICE, SUBSTRATE TRANSFER SYSTEM AND SUBSTRATE TRANSFER METHOD

(71) Applicant: Samsung Electronics Co., Ltd., Suwon-si (KR)

(72) Inventors: Jun Kyu Lee, Suwon-si (KR); Hongjin Kim, Suwon-si (KR); Jeongjae Bang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 369 days.

(21) Appl. No.: 18/138,771

(22) Filed: Apr. 25, 2023

(65) Prior Publication Data

US 2024/0038563 A1  Feb. 1, 2024

(30) Foreign Application Priority Data

Aug. 1, 2022 (KR) .................. 10-2022-0095476

(51) Int. Cl.
| | |
|---|---|
| *H01L 21/677* | (2006.01) |
| *B65G 17/20* | (2006.01) |
| *B66C 7/12* | (2006.01) |
| *B66C 9/04* | (2006.01) |
| *B66C 13/04* | (2006.01) |

(Continued)

(52) U.S. Cl.
CPC ........ *H01L 21/67706* (2013.01); *B65G 17/20* (2013.01); *B66C 7/12* (2013.01); *B66C 9/04* (2013.01); *B66C 13/04* (2013.01); *B66C 19/00* (2013.01); *F16F 15/08* (2013.01); *H01L 21/67724* (2013.01); *H01L 21/6773* (2013.01); *H01L 21/67733* (2013.01)

(58) Field of Classification Search
CPC ................................................ H01L 21/67733
See application file for complete search history.

(56) References Cited

U.S. PATENT DOCUMENTS

| | | | |
|---|---|---|---|
| 8,579,128 B2 | 11/2013 | Kawabata | |
| 9,896,283 B2* | 2/2018 | Tsuji | ................ H01L 21/68707 |
| 11,152,240 B2 | 10/2021 | Myoung et al. | |

(Continued)

FOREIGN PATENT DOCUMENTS

| | | |
|---|---|---|
| CN | 111863681 A | 10/2020 |
| JP | 2015-196569 A | 11/2015 |

(Continued)

*Primary Examiner* — Jonathan Snelting
(74) *Attorney, Agent, or Firm* — Muir Patent Law, PLLC

(57) ABSTRACT

A substrate transfer device includes a housing accommodating a carrier for storing a substrate, a carrier lifter moving the carrier in a vertical direction relative to an upper surface of the housing, a vertical stabilization unit connected to a lower part of the carrier lifter and reducing a vertical vibration of the carrier, a rotation stabilization unit connected to a lower part of the vertical stabilization unit and reducing rotation of the carrier, and a carrier holder connected to a lower part of the rotation stabilization unit. The carrier holder holds the carrier. The vertical stabilization unit includes an upper plate connected to the carrier lifter, a lower plate connected to the rotation stabilization unit, and a buffer disposed between the upper plate and the lower plate. The buffer contracts or relaxes to reduce the vertical vibration of the carrier.

20 Claims, 15 Drawing Sheets

(51) Int. Cl.
　　　*B66C 19/00*　　　(2006.01)
　　　*F16F 15/08*　　　(2006.01)

(56) References Cited

U.S. PATENT DOCUMENTS

| | | | |
|---|---|---|---|
| 12,106,992 B2 * | 10/2024 | Kobayashi | ............ B66C 13/085 |
| 2020/0270102 A1 * | 8/2020 | Wada | ................ H01L 21/67259 |
| 2021/0249283 A1 | 8/2021 | Lee et al. | |
| 2021/0384052 A1 | 12/2021 | Li et al. | |
| 2022/0108906 A1 | 4/2022 | Cho | |

FOREIGN PATENT DOCUMENTS

| | | |
|---|---|---|
| KR | 1020170050924 A | 5/2017 |
| KR | 1020170065235 A | 6/2017 |
| KR | 1020180103621 A | 9/2018 |
| KR | 1020210107461 A | 9/2021 |

\* cited by examiner

SUBSTRATE TRANSFER DEVICE, SUBSTRATE TRANSFER SYSTEM AND SUBSTRATE TRANSFER METHOD

CROSS-REFERENCE TO RELATED APPLICATION

This application claims priority from Korean Patent Application No. 10-2022-0095476 filed on Aug. 1, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate transfer device, a substrate transfer system, and a substrate transfer method.

2. Description of the Related Art

In order to transfer a substrate (e.g., a semiconductor wafer) in a production line that manufactures a semiconductor device, a transfer system for transferring a carrier (e.g., a front opening unified pod (FOUP) or a front opening shipping box (FOSB) that accommodates a plurality of substrates has been employed. Such a substrate transfer system is gradually automated using an overhead hoist transport (OHT) system installed at a manufacturing facility.

The OHT system may include a rail attached at a ceiling of the manufacturing facility and an OHT vehicle. The OHT vehicle transports a substrate by traveling along the rail installed at the ceiling. When the OHT vehicle travels along the rail, vibration may occur to the OHT vehicle due to a mismatch of the rail. Such vibration is transmitted to the substrate, leading to cracks in the substrate or defects in reliability and similar phenomena.

SUMMARY

Aspects of the present disclosure provide a substrate transfer device that minimizes vibration.

Aspects of the present disclosure also provide a substrate transfer system that minimizes vibration.

Aspects of the present disclosure also provide a substrate transfer method that minimizes vibration.

According to some aspects of the present inventive concept, a substrate transfer device includes a housing configured to accommodate a carrier for storing a substrate, a carrier lifter disposed in the housing and configured to move the carrier in a vertical direction relative to an upper surface of the housing, a vertical stabilization unit disposed under the carrier lifter and connected to a lower part of the carrier lifter, wherein the vertical stabilization unit is configured to reduce a vertical vibration of the carrier, a rotation stabilization unit disposed under the vertical stabilization unit and connected to a lower part of the vertical stabilization unit, wherein the rotation stabilization unit is configured to reduce rotation of the carrier, and a carrier holder disposed under the rotation stabilization unit and connected to a lower part of the rotation stabilization unit. The carrier holder is configured to hold the carrier. The vertical stabilization unit comprises an upper plate connected to the carrier lifter, a lower plate disposed under the upper plate and connected to the rotation stabilization unit, and a buffer disposed between the upper plate and the lower plate. The buffer contracts or relaxes to reduce the vertical vibration of the carrier.

According to some aspects of the present inventive concept, a substrate transfer system includes a rail installed on a ceiling, a traveling unit traveling along the rail in a first horizontal direction, a housing disposed under a lower part of the traveling unit and connected to the lower part of the traveling unit, wherein the housing is configured to accommodate a carrier for storing a substrate, a carrier lifter disposed in the housing and configured to move the carrier in a vertical direction perpendicular to the first horizontal direction, a vertical stabilization unit disposed under a lower part of the carrier lifter and connected to the lower part of the carrier lifter, wherein the vertical stabilization unit is configured to reduce a vertical vibration of the carrier, a rotation stabilization unit disposed under a lower part of the vertical stabilization unit and connected to the lower part of the vertical stabilization unit, wherein the rotation stabilization unit is configured to reduce rotation of the carrier with respect to a first rotation direction of rotating around an axis extending in a second horizontal direction perpendicular to the first horizontal direction and the vertical direction, and a carrier holder disposed under a lower part of the rotation stabilization unit and connected to the lower part of the rotation stabilization unit. The carrier holder is configured to hold the carrier. The vertical stabilization unit includes an upper plate connected to the carrier lifter, a lower plate disposed under the upper plate and connected to the rotation stabilization unit, and a buffer disposed between the upper plate and the lower plate. The buffer contracts or relaxes to reduce the vertical vibration of the carrier. The carrier lifter moves the vertical stabilization unit, the rotation stabilization unit, and the carrier holder in the vertical direction using a belt connected to the upper plate.

According to some aspects of the present inventive concept, a substrate transfer method includes providing a substrate transfer device, accommodating a carrier in a housing of the substrate transfer device, moving the substrate transfer device along a rail in a first horizontal direction to move the carrier in the first horizontal direction, counteracting, using an acceleration sensor, rotation of the carrier during a time when the substrate transfer device moves along the rail, and counteracting, using an elastic buffer, vertical vibration of the carrier during a time when the carrier moves downwards.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
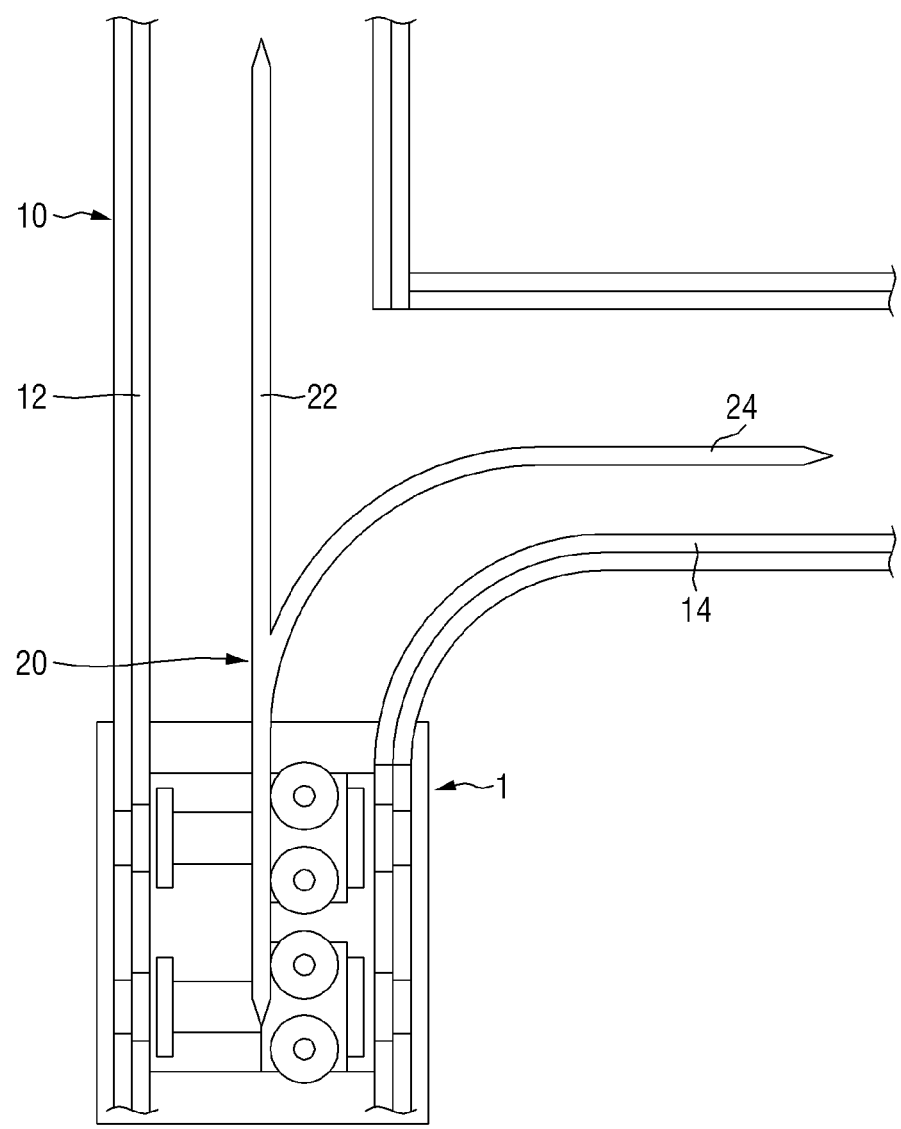
FIGS. 1 and 2 are top plan views describing a substrate transfer system according to some embodiments.
Figure 2:
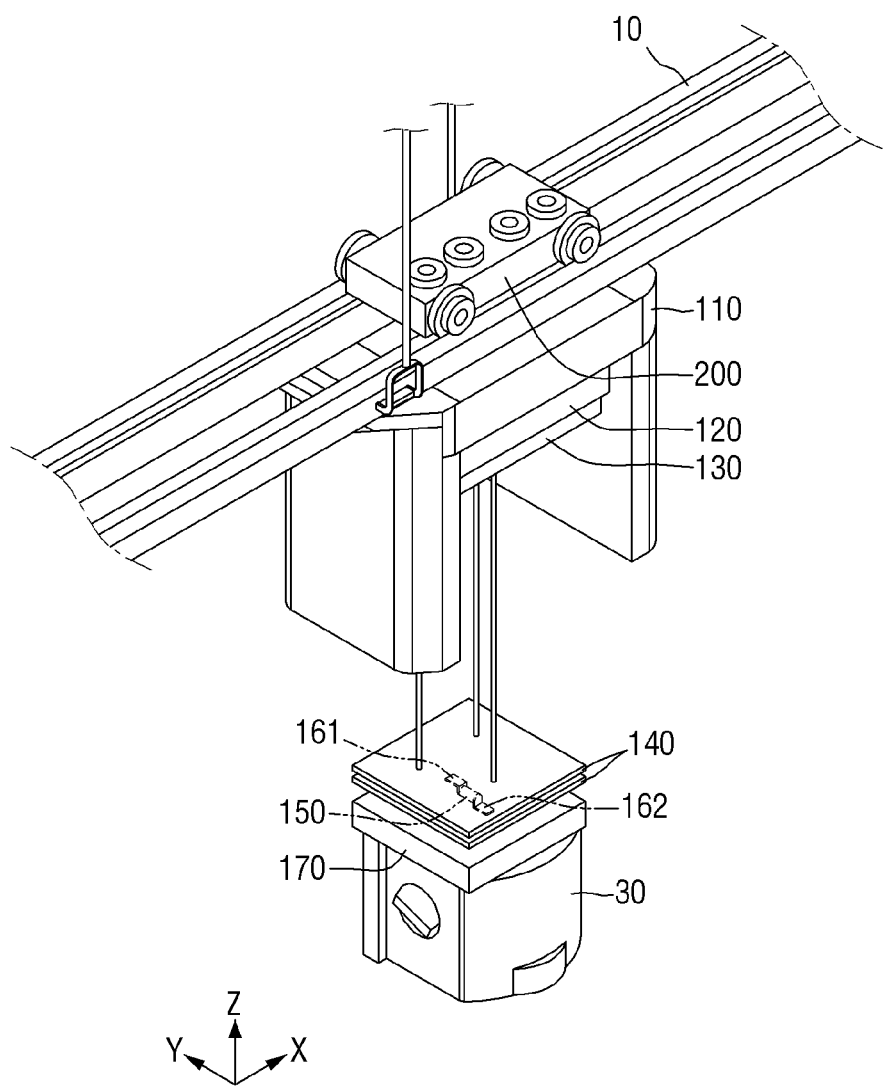
Figure 3:
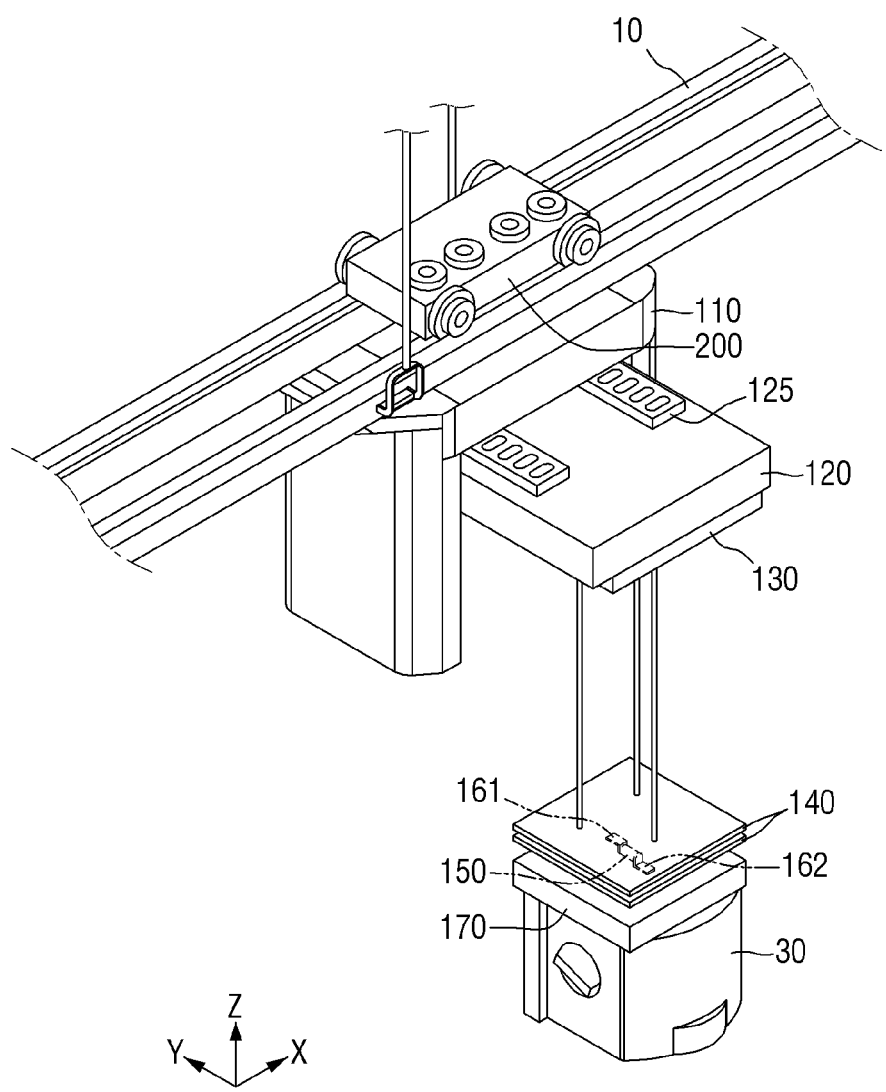
FIG. 3 is a diagram describing operation of a substrate transfer system according to some embodiments.
Figure 4:
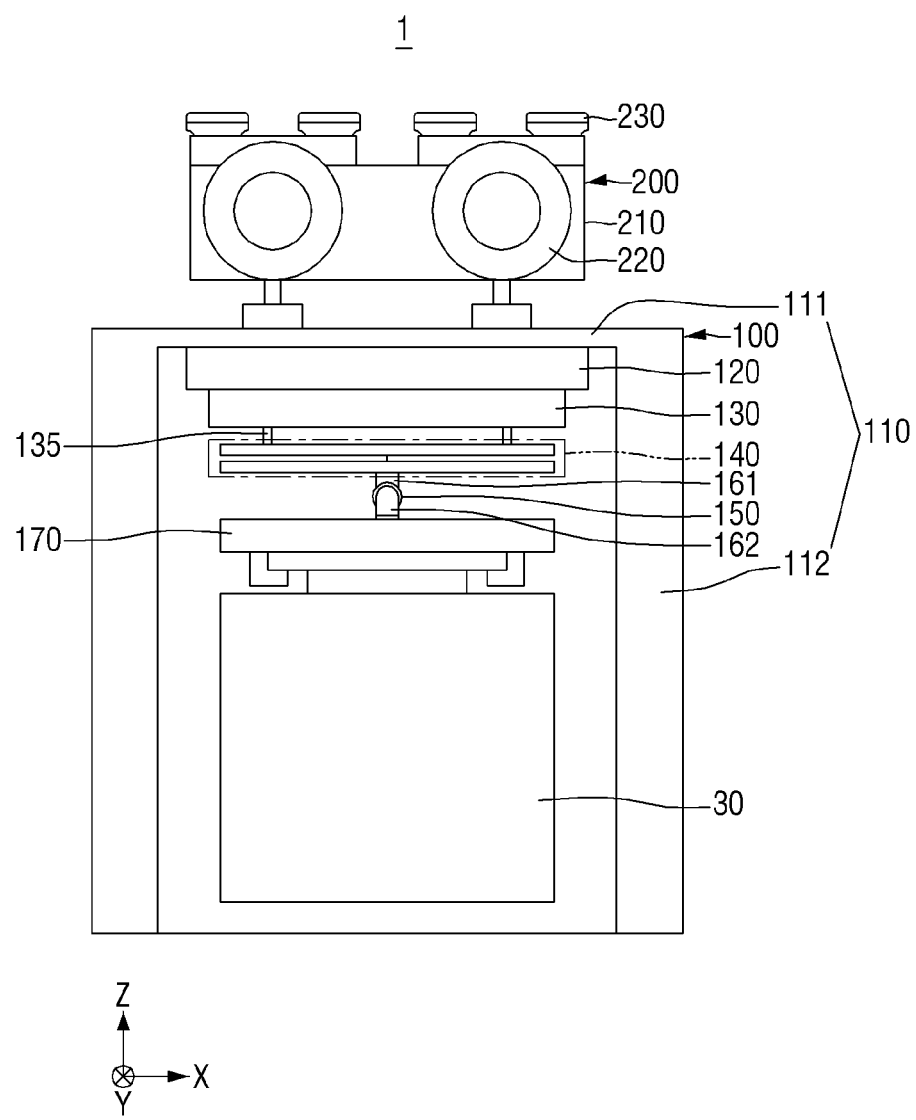
FIG. 4 is a diagram describing a substrate transfer device according to some embodiments.

Hereinafter, embodiments of the present disclosure will be described with reference to the attached drawings:

FIGS. 1 and 2 are top plan views describing a substrate transfer system according to some embodiments. FIG. 3 is a diagram describing operation of a substrate transfer system according to some embodiments. FIG. 4 is a diagram describing a substrate transfer device according to some embodiments.

Referring to FIGS. 1 to 4, the substrate transfer system according to some embodiments may include a substrate transfer device 1 (i.e., an OHT vehicle), a traveling rail 10, and a steering rail 20.

The traveling rail 10 may include, for example, a straight rail 12 and a branch rail 14. The branch rail 14 may be a rail branched from the traveling rail 10 to another traveling rail extending in a direction different from an extending direction of the traveling rail 10.

The steering rail 20 may include a straight steering rail 22 and a branch steering rail 24. The steering rail 20 may be used to change a traveling route of a substrate transfer device 1.

The straight steering rail 22 may guide straight traveling while extending along the straight rail 12. The branch steering rail 24 may guide branch traveling while extending along the branch rail 14.

The substrate transfer device 1 may include a transfer unit 100 and a traveling unit 200.

The traveling unit 200 may include a body 210, a traveling wheel 220, and a steering wheel 230.

The traveling wheels 220 may be disposed on opposite side surfaces of the body 210. The traveling wheel 220 may rotate in contact with the traveling rail 10. Accordingly, the body 210 may travel along the traveling rail 10.

The steering wheel 230 may be disposed on an upper surface of the body 210. The steering wheel 230 may be provided to rotate in a direction perpendicular to the rotation direction of the traveling wheel 220. For example, when the traveling wheel 220 rotates around an axis of a second direction Y so that the body 210 travels in a first direction X, the steering wheel 230 may rotate around a third direction Z. The steering wheel 230 may be in contact with the steering rail 20. The term "contact," as used herein, refers to a direct connection (i.e., physical touching) unless the context indicates otherwise.

The transfer unit 100 may include a housing 110, a sliding portion 120 (i.e., a horizontal slider), a lifting portion 130 (i.e., a carrier lifter), a vertical stabilization unit 140, a rotation stabilization unit 150 (i.e., an inclination stabilization unit), and a grip portion 170 (i.e., a carrier holder).

The housing 110 may include an upper frame 111 and a side frame 112. The housing 110 may surround or may partially surround the sliding portion 120, the lifting portion 120, the vertical stabilization unit 140, the rotation stabilization unit 150, and the grip portion 170. The housing 110 may provide a space accommodating a carrier 30 for storing a substrate.

The upper frame 111 may be disposed under a lower part of the traveling unit 200. The upper frame 111 may be connected to the lower part of the traveling unit 200. The upper frame 111 may extend in the first direction X in which the traveling unit 200 travels. The upper frame 111 may be disposed between the traveling unit 200 and the sliding portion 120.

The side frame 112 may extend in the vertical direction from the upper frame 111. For example, the side frame 112 may extend in the third direction Z. In some embodiments, the side frame 112 may include or may be formed of a pair of frames (i.e., a pair of planar plates). The pair of frames may be spaced apart from each other in the first direction X and extend in parallel in the third direction Z.

The sliding portion 120 may be disposed in the housing 110. The sliding portion 120 may be disposed under a lower part of the upper frame 111. The sliding portion 120 may move horizontally through an open side of the housing 110 which corresponds to an opening between the pair of frames. Specifically, the sliding portion 120 may horizontally move in the second direction Y between the side frames 112 spaced apart from each other in the first direction X. The sliding portion 120 may slide the lifting portion 130 placed in the housing 110 in the second direction Y. The sliding portion 120 may include a slider 125 on an upper face of the sliding portion 120. The sliding portion 120 may horizontally move through the slider 125. Accordingly, the sliding portion 120 may horizontally move in the second direction Y to move the carrier 30 to the outside of the housing 110 via the open side of the housing 110.

The lifting portion 130 may be disposed in the housing 110. The lifting portion 130 may be disposed under a lower part of the sliding portion 120. The lifting portion 130 may be connected to the lower part of the sliding portion 120. The lifting portion 130 may be disposed on the vertical stabilization unit 140. The lifting portion 130 may be connected to the vertical stabilization unit 140 through a belt 135. The lifting portion 130 may ascend or descend the vertical stabilization unit 140 by using the belt 135. In some embodiments, the lifting portion 130 may include a motor to wind or unwind the belt 135.

The lifting portion 130 may move the vertical stabilization unit 140, the rotation stabilization unit 150, and the grip portion 170 in the third direction Z. Accordingly, the lifting portion 130 may move the carrier 30 in the third direction Z. Specifically, the lifting portion 130 may ascend or descend the grip portion 170 by unwinding or winding the belt 135.

The vertical stabilization unit 140 may be disposed in the housing 110. Specifically, the vertical stabilization unit 140 may be disposed in the housing 110 in a state where the lifting portion 130 ascends the carrier 30. The vertical stabilization unit 140 may be disposed under a lower part of the lifting portion 120. The vertical stabilization unit 140 may be disposed on the rotation stabilization unit 150. The vertical stabilization unit 140 can reduce vibration of the carrier 30 in the third direction Z (i.e., reduce vertical vibration of the carrier 30).

The vertical stabilization unit 140 will be described in detail with reference to FIGS. 6 to 15.

The rotation stabilization unit 150 may be disposed in the housing 110. Specifically, the rotation stabilization unit 150 may be disposed in the housing 110 in the state where the lifting portion 130 ascends the carrier 30. The rotation stabilization unit 150 may be disposed in a lower part of the vertical stabilization unit 140. The rotation stabilization unit 150 may be connected to the vertical stabilization unit 140 via an upper connection unit 161. The rotation stabilization unit 150 may be disposed on the grip portion 170. The rotation stabilization unit 150 may be connected to the grip portion 170 via a lower connection portion 162.

The rotation stabilization unit 150 will be described in detail with reference to FIG. 5.

The grip portion 170 may be disposed in the housing 110. Specifically, the grip portion 170 may be disposed in the housing 110 in the state where the lifting portion 130 ascends the carrier 30. The grip portion 170 may be disposed in a lower part of the rotation stabilization unit 150. The grip portion 170 may grip the carrier 30. The grip portion 170 may move in the third direction Z by allowing the lifting portion 130 to unwind or wind the belt 135.

Figure 5:
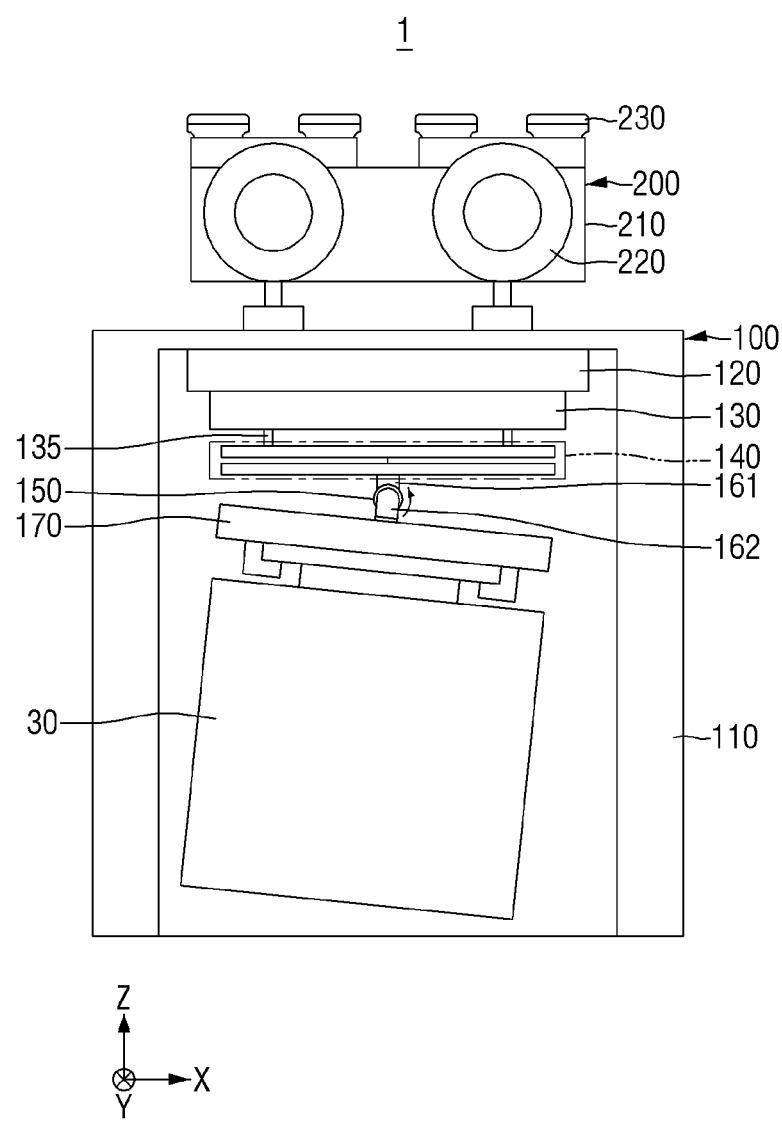
FIG. 5 is a diagram describing an operation of the rotation stabilization unit of the substrate transfer device according to some embodiments.

FIG. 5 is a diagram describing an operation of the rotation stabilization unit of the substrate transfer device according to some embodiments.

Referring to FIG. 5, the rotation stabilization unit 150 may reduce rotation of the carrier 30 or inclination of the carrier 30. Specifically, the rotation stabilization unit 150 may reduce or counteract the rotation of the carrier 30 around an axis extending in the second direction Y. The second direction Y may refer to a direction perpendicular to the first direction X in which the substrate transfer device 1 travels and the third direction Z in which the carrier 30 ascends and descends. In some embodiments, the rotation stabilization unit 150 may reduce inclination of the carrier 30 relative to an upper surface of the housing 110 or an upper surface of the upper frame 111. As a comparison example, if the substrate transfer device 1 moves in the first direction X and does not include the rotation stabilization unit 150, the carrier 30 may swing around an axis extending along the second direction Y and may be inclined relative to the upper surface of the housing 110.

The carrier 30 may partially rotate around the axis extending in the second direction Y. For example, when there is a mismatch such as a concave-convex part in the rail, the substrate transfer device 1 may vibrate while the substrate transfer device 1 travels. In that case, the carrier 30 may vibrate in a parabolic shape. For another example, the carrier 30 may vibrate in a parabolic shape while the lifting portion 120 ascends or descends the carrier 30. When the sliding portion 120 moves in the second direction Y and moves the carrier 30 to the outside of the housing 110, the carrier 30 may vibrate in a parabolic shape. In that case, the carrier 30 may vibrate clockwise or counterclockwise.

The rotation stabilization unit 150 may reduce or counteract vibration (e.g., vertical vibration) by moving the carrier 30 in the direction opposite to the direction in which the carrier 30 rotates or vibrates. For example, when the carrier 30 vibrates or is inclined along a path of a parabola in a clockwise direction, the rotation stabilization unit 150 may rotate the carrier 30 in a counterclockwise direction. In other words, the rotation stabilization unit 150 may offset or counteract the rotation or vibration of the carrier 30 by rotating the carrier 30 in the direction opposite to the direction in which the carrier 30 rotates or vibrates. Accordingly, the rotation stabilization unit 150 may allow the carrier 30 to remain horizontal.

The rotation stabilization unit 150 may measure the direction in which the carrier 30 inclines, rotates, or vibrates. The rotation stabilization unit 150 may include an acceleration sensor configured to measure the acceleration of the carrier 30. The rotation stabilization unit 150 may include a drive unit configured to rotate the carrier 30 in the direction opposite to the direction in which the carrier 30 inclines, rotates, or vibrates. For example, a drive unit of the rotation stabilization unit 150 may include a motor.

Figure 6:
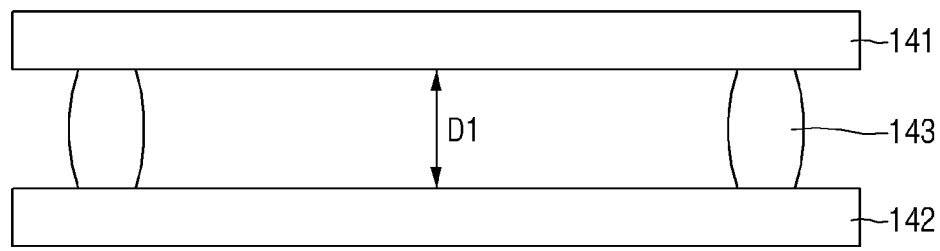
FIGS. 6 and 7 are views describing the vertical stabilization unit of the substrate transfer device according to some embodiments.
Figure 6:
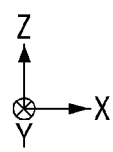
Figure 7:
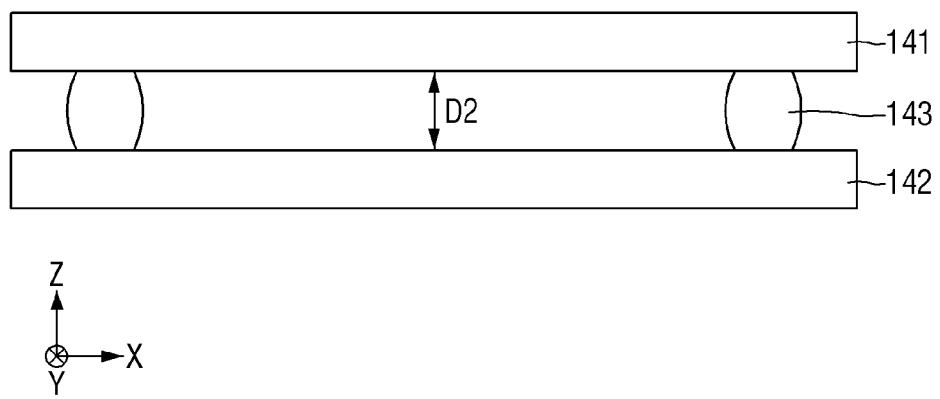

FIGS. 6 and 7 are views describing the vertical stabilization unit of the substrate transfer device according to another embodiment.

Referring to FIGS. 4, 6 and 7, the vertical stabilization unit 140 may include an upper plate 141, a lower plate 142, and a buffer 143.

The upper plate 141 and the lower plate 142 may be spaced apart from each other in the third direction Z. The upper plate 141 and the lower plate 142 may be disposed parallel with each other.

The upper plate 141 may be connected to the lifting portion 130. The upper plate 141 may be connected to the belt 135 to ascend or descend in the third direction Z. The lower plate 142 may be connected to the rotation stabilization unit 150.

The buffer 143 may be disposed between the upper plate 141 and the lower plate 142. The buffer 143 may be fixed to a lower surface of the upper plate 141. The buffer 143 may be fixed to an upper surface of the lower plate 142. For example, the buffer 143 may be attached to the upper plate 141 and the lower plate 142.

The buffer 143 may include or may be formed of an elastic material. The buffer 143 may include or may be formed of a material that absorbs vibration. In order to reduce the vibration of the carrier 30 in the third direction Z, the buffer 143 may contract or relax. Specifically, the buffer 143 may contract or relax in the same direction as the direction in which the carrier 30 moves in the third direction Z. In some embodiments, the buffer 143 may contract or relax to reduce the vertical vibration of the carrier 30.

When the carrier 30 vibrates downwards in the third direction Z, the buffer 143 can relax to prevent an impact from being applied to the substrate stored in the carrier 30. For example, referring to FIGS. 4 and 6, when the carrier 30 vibrates in a direction away from the upper plate 141 or the lower plate 142, the buffer 143 may relax. Accordingly, the buffer 143 may buffer or relieve the impact applied to the substrate stored in the carrier 30 even when the carrier 30 vibrates in the third direction Z.

When the carrier 30 vibrates upwards in the third direction Z, the buffer 143 can contract to prevent the impact from being applied to the substrate stored in the carrier 30. For example, referring to FIGS. 4 and 7, when the carrier 30 vibrates in a direction approaching the upper plate 141 or the lower plate 142, the buffer 143 may contract. Accordingly, the buffer 143 may buffer the impact applied to the substrate stored in the carrier 30 even when the carrier 30 vibrates in the third direction Z.

As the buffer 143 contracts or relaxes, a distance between the upper plate 141 and the lower plate 142 may change. Referring to FIG. 6, for example, when the buffer 143 relaxes, the distance between the upper plate 141 and the lower plate 142 may be a first distance D1. For another example, referring to FIG. 7, when the buffer 143 contracts, the distance between the upper plate 141 and the lower plate 142 may be a second distance D2. In that case, the first distance D1 and the second distance D2 may be different from each other.

Figure 8:
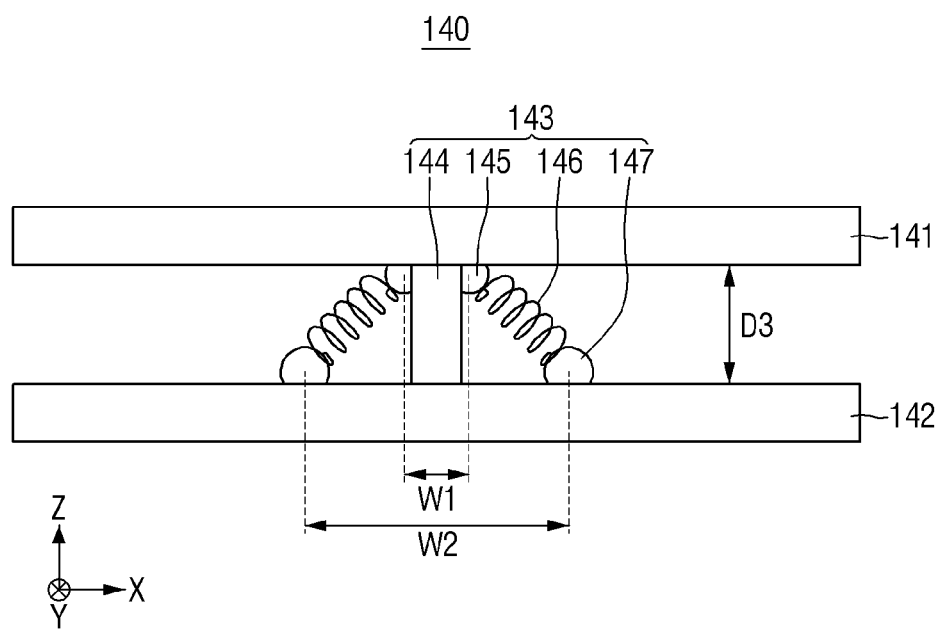
FIGS. 8 and 9 are views describing the vertical stabilization unit of the substrate transfer device according to some embodiments.
Figure 9:
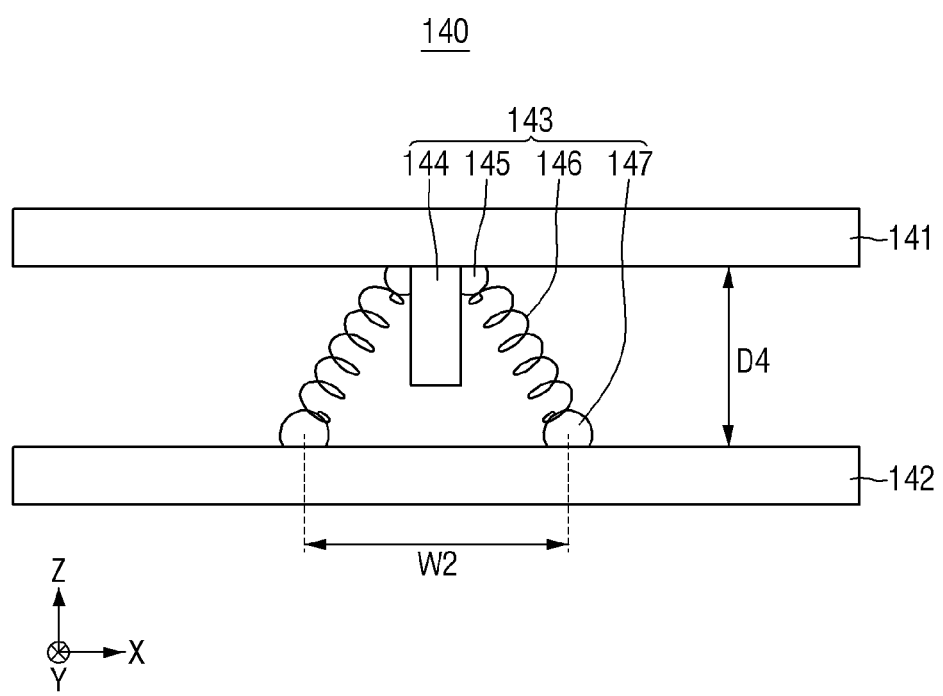

FIGS. 8 and 9 are views describing the vertical stabilization unit of the substrate transfer device according to some embodiments. For convenience of description, in what follows, the differences from those described with reference to FIGS. 6 and 7 will be mainly described.

Referring to FIGS. 8 and 9, the buffer 143 of the vertical stabilization unit 140 may include a pillar 144, an upper contact 145, a connector 146, and a lower contact 147.

The pillar 144 may be disposed in a central part. For example, the pillar 144 may be disposed in the centers of the upper plate 141 and the lower plate 142 in the first direction X. The pillar 144 may be fixed to the upper plate 141. The pillar 144 may be connected to the upper plate 141. For example, the pillar 144 may be connected to the center of the upper plate 141. The pillar 144 may detachably contact the lower plate 142 without being fixed to the lower plate 142. For example, the pillar 144 may be spaced apart from the lower plate 142 to reduce the vertical vibration of the carrier 30.

The upper contact 145 may be disposed on the lower surface of the upper plate 141. The upper contact 145 may be fixed to the lower surface of the upper plate 141. The upper contacts 145 may be spaced apart from each other in the first direction X and disposed on a side part of the pillar 144. The upper contacts 145 may be spaced apart from each other by a first width W1. In some embodiments, the upper contact 145 may include or may be a hook connected to the lower surface of the upper plate 141.

The lower contact 147 may be disposed on the upper surface of the lower plate 142. The lower contact 147 may be fixed to the upper surface of the lower plate 142. The lower contacts 147 may be spaced apart from each other in the first direction X and disposed on the side part of the pillar 144. The lower contacts 147 may be spaced apart from each other by a second width W2. In that case, the second width W2 may be larger than the first width W1. In other words, the lower contacts 147 may be spaced apart from each other by a greater distance than the upper contacts 145 are spaced apart from each other. In some embodiments, the lower contact 147 may include or may be a hook connected to the upper surface of the lower plate 142.

The connector 146 may connect the upper contact 145 and the lower contact 147. The connector 146 may have a structure that buffers an impact. For example, the connector 146 may have a spring shape. Since the distance disposed in the first direction X between the upper contacts 145 is different from the distance disposed in the first direction X between the lower contacts 147, the connector 146 may be inclined relative to the upper surface of the lower plate 142 or the lower surface of the upper plate 141.

When the carrier 30 vibrates upwards in the third direction Z, the connector 146 may contract. In other words, when the carrier 30 moves upwards in the third direction Z, the distance between the upper plate 141 and the lower plate 142 may decrease. For example, referring to FIG. 8, when the carrier 30 vibrates and moves in the direction approaching the upper plate 141 or the lower plate 142, the connector 146 may contract. Accordingly, even if the carrier 30 vibrates in the third direction Z, the buffer 143 may buffer the impact applied to the substrate in the carrier 30.

When the carrier 30 vibrates downwards in the third direction Z, the connector 146 may relax. When the carrier 30 moves downwards in the third direction Z, the distance between the upper plate 141 and the lower plate 142 may increase. For example, referring to FIG. 9, when the carrier 30 vibrates and moves in the direction away from the upper plate 141 or the lower plate 142, the connector 146 may relax. Accordingly, even if the carrier 30 vibrates in the third direction Z, the buffer 143 may buffer or relieve the impact applied to the substrate in the carrier 30.

As the connector 146 contracts or relaxes, the distance between the upper plate 141 and the lower plate 142 may change. Referring to FIG. 8, for example, when the buffer 143 contracts, the distance between the upper plate 141 and the lower plate 142 may be a third distance D3. For another example, referring to FIG. 9, when the buffer 143 relaxes, the distance between the upper plate 141 and the lower plate 142 may be a fourth distance D4. In that case, the third distance D3 and the fourth distance D4 may be different from each other.

As the connector 146 contracts or relaxes, even if the distance between the upper plate 141 and the lower plate 142 changes, the distance between the lower contacts 147 can remain constant. When the connector 146 contracts such that the upper plate 141 and the lower plate 142 are spaced apart from each other by the third distance D3, the connector 146 relaxes such that the upper plate 141 and the lower plate 142 are spaced apart from each other by the fourth distance D4. The lower contacts 147 may be spaced apart from each other by the second width W2.

Figure 10:
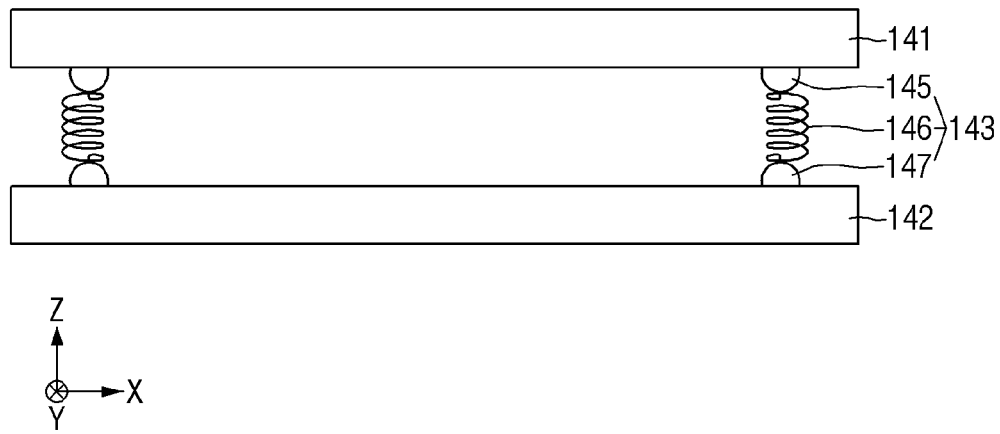
FIG. 10 is a view describing the vertical stabilization unit of the substrate transfer device according to some embodiments.

FIG. 10 is a view describing the vertical stabilization unit of the substrate transfer device according to some embodiments. For convenience of description, in what follows, the differences from those described with reference to FIGS. 8 and 9 will be mainly described.

The connector 146 may be vertically disposed between the upper plate 141 and the lower plate 142 without being inclined. Since the distance between the upper contacts 145 may be identical to the distance between the lower contacts 147. Accordingly, the connector 146 connecting the upper contact 145 and the lower contact 147 is not inclined, but may extend perpendicularly to the upper plate 141 and the lower plate 142 along the third direction Z.

However, even in this case, the connector 146 may reduce vibration transmitted to the carrier 30 by contracting or relaxing in the same direction as the direction in which the carrier 30 moves under the lower plate 142.

FIGS. 11 to 14 are views describing the vertical stabilization unit of the substrate transfer device according to some embodiments. For convenience of description, in what follows, the differences from those described with reference to FIGS. 6 to 10 will be mainly described.

Referring to FIGS. 11 to 14, the buffer 143 of the vertical stabilization unit 140 may include a pillar 144, an upper contact 145, a connector 146, and a lower contact 147, and a bumper 148.

The upper contact 145 may be disposed on the lower surface of the upper plate 141 in a state where it is fixed to the side part of the pillar 144. The upper contact 145 may be fixed to the upper plate 141.

The connector 146 may have a rod shape. The connector 146 may connect the upper contact 145 to the lower contact 147. The connector 146 may be rigid. For example, the connector 146 may not be elastic.

The lower plate 142 of the vertical stabilization unit 140 may include a groove 149. The groove 149 may include a lower groove 149a and an upper groove 149b. The bumper 148 may be disposed in the groove 149.

The bumper 148 may buffer an impact when the lower contact 147 moves in the groove 149. For example, as illustrated in FIG. 11, when the lower contact 147 is disposed at the outermost side in the first direction X in the groove 149, the bumper 148 may prevent the lower contact 147 from colliding with an inner surface of the lower plate 142.

The lower contact 147 may include an extension portion 147*a* and a rolling portion 147*b*. The lower contact 147 may be inserted into the groove 149 of the lower plate 142. Specifically, the lower contact 147 may be fitted into the lower groove 149*a*. A lower end of the connector 146 may be fitted into the upper groove 149*b*. The lower groove 149*a* may have a width greater than that of the upper groove 149*b*. Accordingly, the lower contact 147 fitted into the lower groove 149*a* may be fixed.

Figure 11:
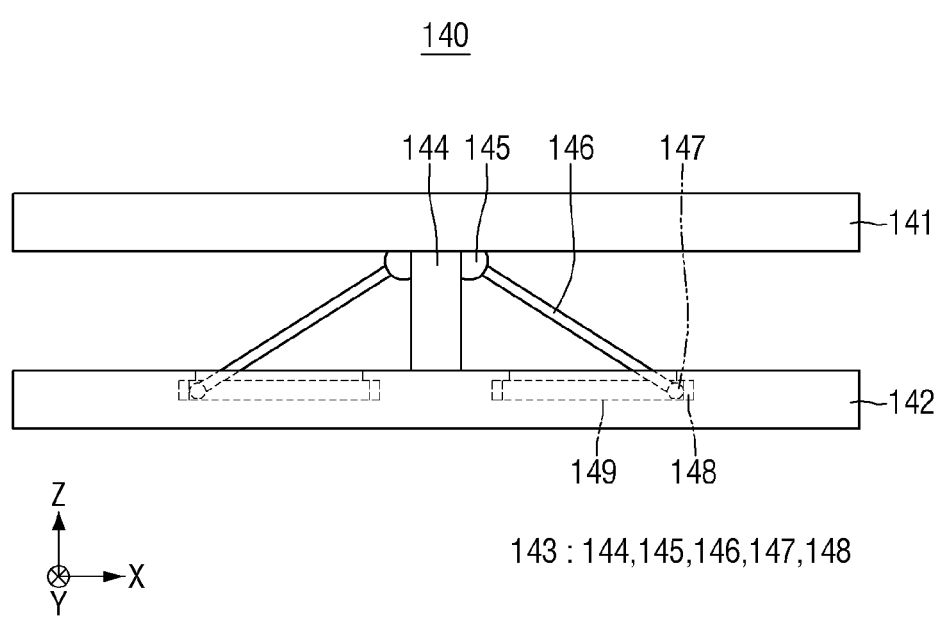
FIGS. 11 to 14 are views describing the vertical stabilization unit of the substrate transfer device according to some embodiments.
Figure 12:
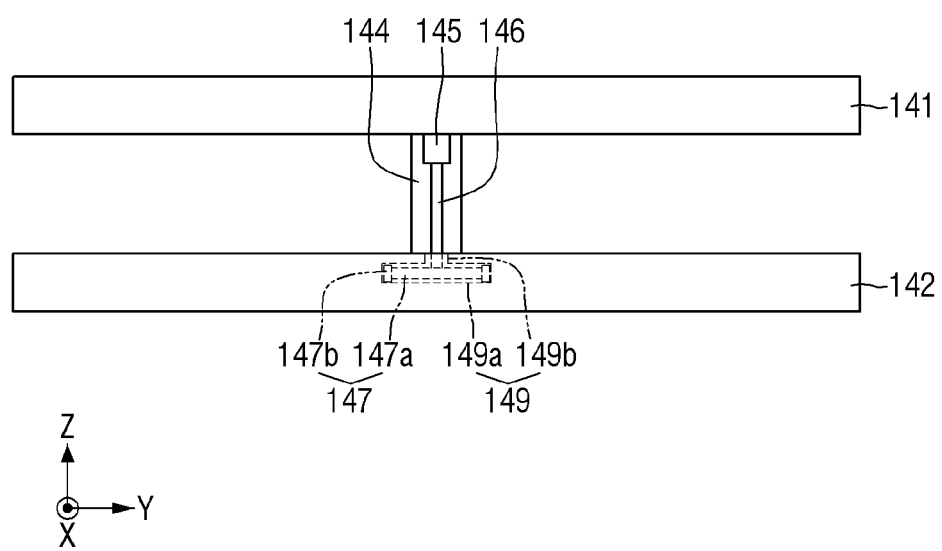
Figure 13:
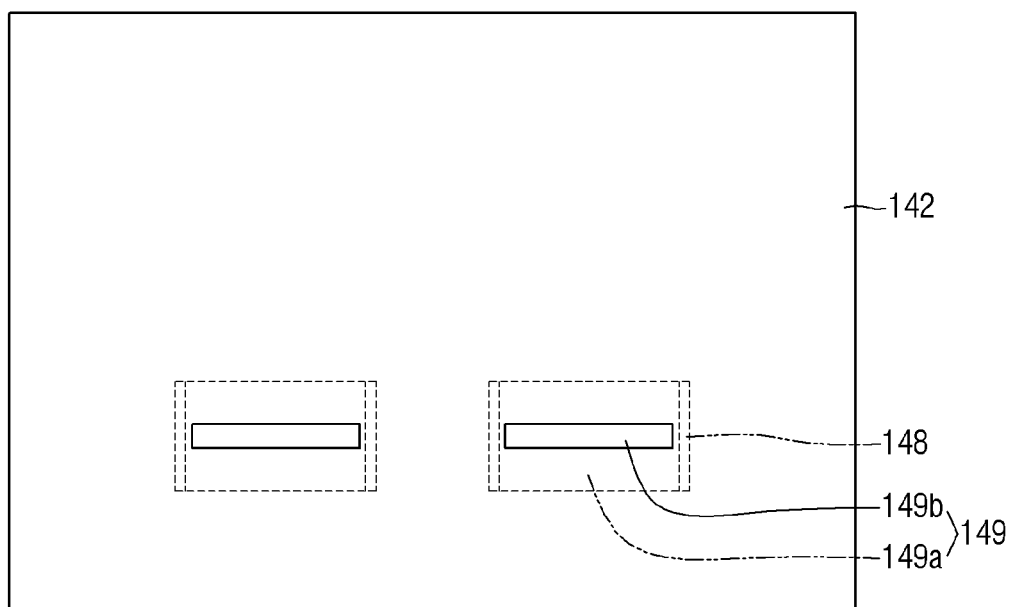

Referring to FIGS. 4 and 11, when vibration caused by a pressing force from the top is transmitted to the carrier 30 in the third direction Z, the buffer 143 may narrow the distance between the upper plate 141 and the lower plate 142. For example, the vibration occurring in the process in which the traveling unit 200 travels may be transmitted to the carrier 30 via the housing 110 (e.g., the upper frame 111). For another example, the vibration occurring in the process in which the transfer unit 100 transfers the carrier 30 in the third direction Z may be transmitted from the lower plate 142 to the carrier 30. In that case, the buffer 143 can reduce the distance between the upper plate 141 and the lower plate 142, thereby reducing the vibration transmitted to the carrier 30.

Specifically, the lower contact 147 may be rolled to the outermost side in the groove 149. At the outermost side in the groove 149, the lower contact 147 may be in contact with the bumper 148 disposed at the outside of the groove 149. In that case, the outside may be defined as a direction away from the pillar 144.

Figure 14:
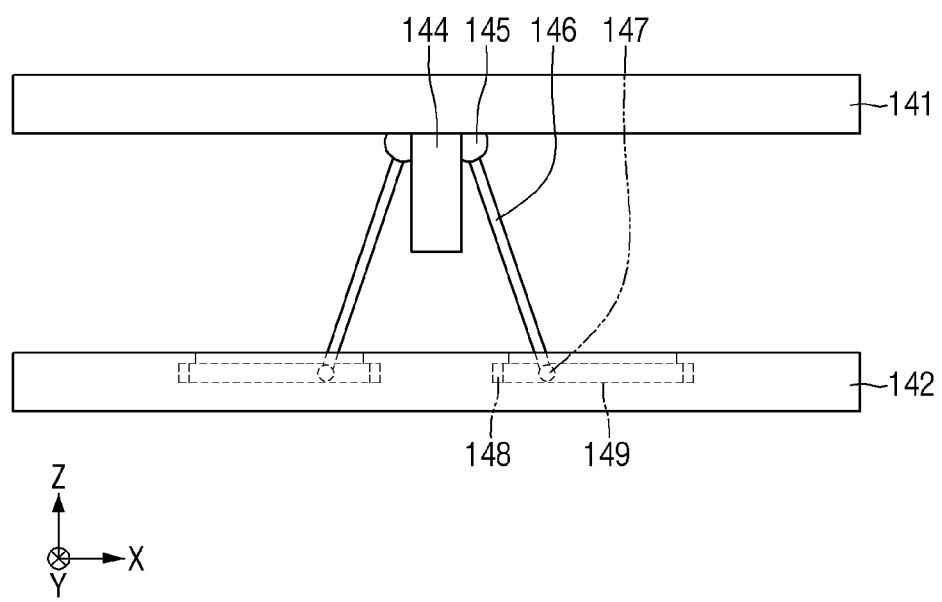

Referring to FIGS. 7 and 14, when vibration caused by a pulling force from the top is transmitted to the carrier 30 in the third direction Z, the buffer 143 may increase the distance between the upper plate 141 and the lower plate 142. In that case, the buffer 143 can increase the distance between the upper plate 141 and the lower plate 142, thereby reducing the vibration transmitted to the carrier 30.

The lower contact 147 may be rolled inwards in the groove 149. The lower contact 147 may be in contact with the bumper 148 disposed at the innermost side of the groove 149, when the lower contact 147 moves inwardly in the first direction X. In that case, the innermost side of the groove 149 may be adjacent to the pillar 144.

Figure 15:
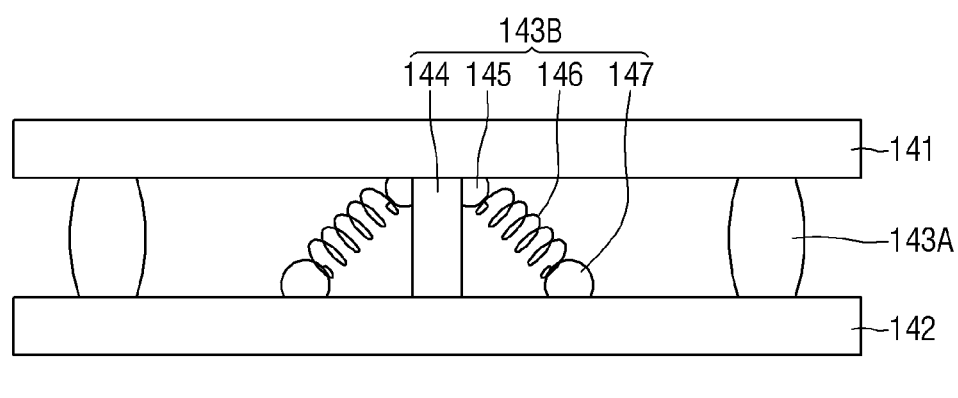
FIG. 15 is a view describing the vertical stabilization unit of the substrate transfer device according to some embodiments.

FIG. 15 is a view describing the vertical stabilization unit of the substrate transfer device according to another embodiment. For convenience of description, in what follows, the differences from those described with reference to FIGS. 6 to 14 will be mainly described.

Referring to FIG. 15, the vertical stabilization unit 140 may include a first buffer 143A and a second buffer 143B.

The first buffer 143A may include or may be formed of an elastic material. The first buffer 143A may be substantially the same as the buffer 143 described with reference to FIGS. 6 and 7. The second buffer 143B may include the pillar 144, the upper contact 145, the connector 146, and the lower contact 147. The second buffer 143B may be substantially the same as the buffer 143 described with reference to FIGS. 8 and 9. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A substrate transfer device, comprising:
    a housing configured to accommodate a carrier for storing a substrate;
    a carrier lifter disposed in the housing and configured to move the carrier in a vertical direction relative to an upper surface of the housing;
    a vertical stabilization unit disposed under the carrier lifter and connected to a lower part of the carrier lifter, wherein the vertical stabilization unit is configured to reduce a vertical vibration of the carrier;
    a rotation stabilization unit disposed under the vertical stabilization unit and connected to a lower part of the vertical stabilization unit,
    wherein the rotation stabilization unit is configured to reduce rotation of the carrier; and
    a carrier holder disposed under the rotation stabilization unit and connected to a lower part of the rotation stabilization unit,
    wherein the carrier holder is configured to hold the carrier,
    wherein the vertical stabilization unit comprises:
        an upper plate connected to the carrier lifter;
        a lower plate disposed under the upper plate and connected to the rotation stabilization unit; and
        a buffer disposed between the upper plate and the lower plate, and
    wherein the buffer contracts or relaxes to reduce the vertical vibration of the carrier.

2. The substrate transfer device of claim 1,
    wherein the buffer includes an elastic material disposed between the upper plate and the lower plate, and
    wherein the elastic material is fixed to the upper plate and the lower plate.

3. The substrate transfer device of claim 1,
    wherein the buffer comprises:
        a pillar fixed to a center of the upper plate;
        a pair of upper contacts fixed to the upper plate and disposed on opposite regions of the pillar, respectively;
        a pair of lower contacts fixed to the lower plate and spaced apart from the pillar; and
        a pair of connectors connecting the pair of upper contacts to the pair of lower contacts, respectively.

4. The substrate transfer device of claim 3,
    wherein a width, in a first horizontal direction, between the pair of upper contacts is smaller than a width, in the first horizontal direction between the pair of lower contacts,
    wherein the first horizontal direction is perpendicular to the vertical direction, and
    wherein each connector of the pair of connectors includes a spring.

5. The substrate transfer device of claim 1, further comprising:
    a traveling unit disposed on the upper surface of the housing and configured to move the housing in a first horizontal direction,
    wherein the rotation stabilization unit is configured to counteract rotation of the carrier in a first rotation direction of rotating around an axis extending in a second horizontal direction perpendicular to the vertical direction and the first horizontal direction.

6. The substrate transfer device of claim 5,
wherein the rotation stabilization unit comprises:
an acceleration sensor configured to measure acceleration of the carrier; and
a drive unit configured to rotate the carrier in a direction opposite to the first rotation direction.

7. The substrate transfer device of claim 1,
wherein the housing comprises:
an upper frame disposed on the carrier lifter; and
a pair of side frames spaced apart from each other in a first horizontal direction and connected to opposite sides of the upper frame, respectively, and
wherein each side frame of the pair of side frames extends downwardly from the upper frame.

8. The substrate transfer device of claim 7,
wherein the rotation stabilization unit is configured to counteract rotation of the carrier in a first rotation direction of rotating around a second horizontal direction perpendicular to the vertical direction and the first horizontal direction.

9. The substrate transfer device of claim 7, further comprising:
a horizontal slider disposed on the carrier lifter in the housing,
wherein the horizontal slider is configured to:
move in a second horizontal direction perpendicular to the vertical direction and the first horizontal direction; and
transfer the carrier to the outside of the housing via an opening between the pair of side frames.

10. The substrate transfer device of claim 1, further comprising:
a belt connecting the carrier lifter to the upper plate,
wherein the carrier lifter moves the vertical stabilization unit, the rotation stabilization unit, and the carrier holder in the vertical direction using the belt.

11. A substrate transfer system, comprising:
a rail installed on a ceiling;
a traveling unit traveling along the rail in a first horizontal direction;
a housing disposed under a lower part of the traveling unit and connected to the lower part of the traveling unit, wherein the housing is configured to accommodate a carrier for storing a substrate;
a carrier lifter disposed in the housing and configured to move the carrier in a vertical direction perpendicular to the first horizontal direction;
a vertical stabilization unit disposed under a lower part of the carrier lifter and connected to the lower part of the carrier lifter,
wherein the vertical stabilization unit is configured to reduce a vertical vibration of the carrier;
a rotation stabilization unit disposed under a lower part of the vertical stabilization unit and connected to the lower part of the vertical stabilization unit,
wherein the rotation stabilization unit is configured to reduce rotation of the carrier with respect to a first rotation direction of rotating around an axis extending in a second horizontal direction perpendicular to the first horizontal direction and the vertical direction; and
a carrier holder disposed under a lower part of the rotation stabilization unit and connected to the lower part of the rotation stabilization unit,
wherein the carrier holder is configured to hold the carrier,
wherein the vertical stabilization unit comprises:
an upper plate connected to the carrier lifter;
a lower plate disposed under the upper plate and connected to the rotation stabilization unit; and
a buffer disposed between the upper plate and the lower plate,
wherein the buffer contracts or relaxes to reduce the vertical vibration of the carrier, and
wherein the carrier lifter moves the vertical stabilization unit, the rotation stabilization unit, and the carrier holder in the vertical direction using a belt connected to the upper plate.

12. The substrate transfer system of claim 11,
wherein the rail includes a traveling rail extending in the first horizontal direction and a steering rail disposed on an upper part of the traveling rail, and
wherein the traveling unit comprises:
a body;
a traveling wheel disposed on a side surface of the body and traveling along the traveling rail; and
a steering wheel disposed on an upper surface of the body and rotating along the steering rail.

13. The substrate transfer system of claim 11,
wherein the housing comprises:
an upper frame disposed on the carrier lifter; and
a pair of side frames spaced apart from each other in the first horizontal direction and connected to opposite sides of the upper frame, respectively, and
wherein each side frame of the pair of side frames extends downwardly from the upper frame.

14. The substrate transfer system of claim 11,
wherein the buffer includes an elastic material disposed between the upper plate and the lower plate, and
wherein the elastic material is fixed to the upper plate and the lower plate.

15. The substrate transfer system of claim 11,
wherein the buffer comprises:
a pillar fixed to a center of the upper plate;
a pair of upper contacts fixed to the upper plate and disposed on opposite regions of the pillar, respectively;
a pair of lower contacts disposed on the lower plate and spaced apart from the pillar; and
a pair of connectors connecting the pair of upper contacts and the pair of lower contacts, respectively.

16. The substrate transfer system of claim 15,
wherein the lower plate includes:
a groove; and
a bumper disposed in the groove, and
wherein each lower contact of the pair of lower contacts includes a rolling portion inserted into the groove and configured to roll in the groove.

17. The substrate transfer system of claim 15,
wherein the pillar is spaced apart from the lower plate.

18. The substrate transfer system of claim 15,
wherein a width, in the first horizontal direction, between the pair of upper contacts is smaller than a width, in the first horizontal direction, between the pair of lower contacts.

19. A substrate transfer method, comprising:
providing a substrate transfer device;
accommodating a carrier in a housing of the substrate transfer device;
moving the substrate transfer device along a rail in a first horizontal direction to move the carrier in the first horizontal direction;

counteracting, using an acceleration sensor, rotation of the carrier during a time when the substrate transfer device moves along the rail; and counteracting, using an elastic buffer, vertical vibration of the carrier during a time when the carrier moves downwards.

20. The substrate transfer method of claim 19, wherein the counteracting of the rotation includes measuring acceleration of the carrier, and wherein the counteracting of the vertical vibration includes moving upper and lower plates in an opposite direction of a vibration direction of the vertical vibration, the elastic buffer connected to each of a lower surface of the upper plate and an upper surface of the lower plate.

* * * * *